USOO6010982A

United States Patent [19]
Hur et al.

[11] Patent Number: 6,010,982
[45] Date of Patent: Jan. 4, 2000

[54] SODIUM-INTERVENED SUPERCONDUCTOR AND ITS MANUFACTURING METHOD

[75] Inventors: Nam Hwi Hur; Jin Tae Kim; Jong Chul Park; Yong Ki Park, all of Daejeon, Rep. of Korea

[73] Assignee: Korea Research Institute of Standards and Science, Daejeon, Rep. of Korea

[21] Appl. No.: 09/222,710

[22] Filed: Dec. 29, 1998

[30] Foreign Application Priority Data

May 15, 1998 [KR] Rep. of Korea .................. 98-17680

[51] Int. Cl.[7] .................... H01L 39/12; H01B 12/00; C04B 35/505; C04B 35/64

[52] U.S. Cl. .................... 505/126; 505/500; 505/742; 505/780

[58] Field of Search .................... 505/125, 126, 505/500, 742, 780

[56] References Cited

FOREIGN PATENT DOCUMENTS

| | | |
|---|---|---|
| 03080109 | 4/1991 | Japan . |
| 94/19281 | 9/1994 | WIPO . |

OTHER PUBLICATIONS

Matsumoto et al. "Superconducting $Y_{1-x}L_xBa_{2-y}M_yCu_{3-z}N_zO_\delta$ ..."Materials Research Bulletin, vol. 23, No. 8, 1988.

*Primary Examiner*—Mark Kopec
*Attorney, Agent, or Firm*—Finnegan, Henderson, Farabow, Garrett & Dunner, L.L.P.

[57] ABSTRACT

The present invention relates to a sodium-intervened superconductor and its manufacturing method and more particularly, to the sodium-intervened superconductor expressed by the following Formula 1 and its manufacturing method, wherein the superconductor, prepared from a stoichiometric mixture of $Y_2O_3$, $NaCuO_2$, $BaCuO_2$, $Ln_2O_3$ (Ln: lanthanide ion) and CuO under the atmosphere of oxygen, has some advantages in that a) through the use of $NaCuO_2$, a ternary oxide, as a reactant, the formation of impurities and sodium evaporation may be prevent, and b) through partial substitution of a divalent barium by a trivalent lanthanide group ion, the superconductor is stable in air with a higher critical current density and critical temperature.

Formula 1

$$(Na_{1-x}Y_x)(Ba_{1-y}Ln_y)_2Cu_3O_{6+\delta}$$

wherein, Ln is a trivalent lanthanide ion other than Ce and Pr; $0.1<x<0.9$; and $0.1<y<0.3$.

2 Claims, 2 Drawing Sheets

SODIUM-INTERVENED SUPERCONDUCTOR AND ITS MANUFACTURING METHOD

BACKGROUND OF THE INVENTION

1. Field of the Invention

The present invention relates to a sodium-intervened superconductor and its manufacturing method and more particularly, to the sodium-intervened superconductor expressed by the following Formula 1 and its manufacturing method, wherein the superconductor, prepared from a stoichiometric mixture of $Y_2O_3$, $NaCuO_2$, $BaCuO_2$, $Ln_2O_3$ (Ln:Lanthanide ion) and CuO under the atmosphere of oxygen, has some advantages in that a) through the use of $NaCuO_2$, a ternary oxide, as a reactant, the formation of impurities and sodium evaporation may be prevented, and b) through partial substitution of a divalent barium by a trivalent lanthanide ion, the superconductor is thermally stable in air with a higher critical current density ($J_c$) and critical temperature ($T_c$):

Formula 1

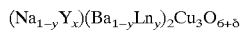

wherein, Ln is a trivalent lanthanide ion other than Ce and Pr; $0.1<x<0.9$; and $0.1<y<0.3$.

2. Description of the Related Art

Superconductivity was discovered from mercury (Hg) by H. Kamerlingh Onnes for the first time in 1908, which is the phenomenon to lose electric resistance when some specific metal or alloy is cooled below certain temperature. The transition temperature is defined as the superconducting critical temperature ($T_c$). Such superconductivity may be found from nearly all metals at sufficiently low temperature but not limited to a few metals, while its temperature may vary depending on the kinds of metal. For example, the $T_c$ of mercury for superconductivity is 4 K and that of an alloy comprising both tin and niobium is 18 K. Besides the metal and intermetallic compounds, the first high temperature oxide superconductor, $La_{2-x}M_xCuO_4$, was invented by Bednorz and Muller in 1986. Since then, a variety of superconductors having higher $T_c$ than liquid nitrogen (boiling point: 77 K) have been successfully synthesized, which is a turning point for the applied studies of superconductivity; among them, $YBa_2Cu_3O_{7-\delta}$, $Bi_2Sr_2Ca_2Cu_3O_{10}$, $Tl_2Ba_2Ca_2Cu_3O_{10}$ and $HgBa_2Ca_2Cu_3O_{8+\delta}$ a superconductors are typical.

However, the superconductors other than $YBa_2Cu_3O_{7-\delta}$ have faced some difficulty in application due to their toxicity and volatility. Even in the yttrium-based superconductor ($YBa_2Cu_3O_{7-\delta}$), it has also recognized some disadvantage in that its superconducting property is drastically changed by the oxygen content.

SUMMARY OF THE INVENTION

Under such situation, the inventors have made intensive studies to develop a stable superconductor in the air with a high $T_c$. As a result, this invention based on the successful manufacture of a novel sodium-intervened superconductor is completed in such a manner that $NaCuO_2$, a ternary oxide, is employed as a reactant and a barium is partially substituted by the lanthanide ion. Compared with $YBa_2Cu_3O_{7-\delta}$, the sodium-intervened superconductor of this invention is far thermally stable and also prepared at lower temperature. The resulting superconductor has a higher $J_c$.

Therefore, an object of this invention is to provide a thermally stable sodium-intervened superconductor having a high $T_c$ and high $J_c$, including its manufacturing method.

DETAILED DESCRIPTION OF THE INVENTION

Figure 1:
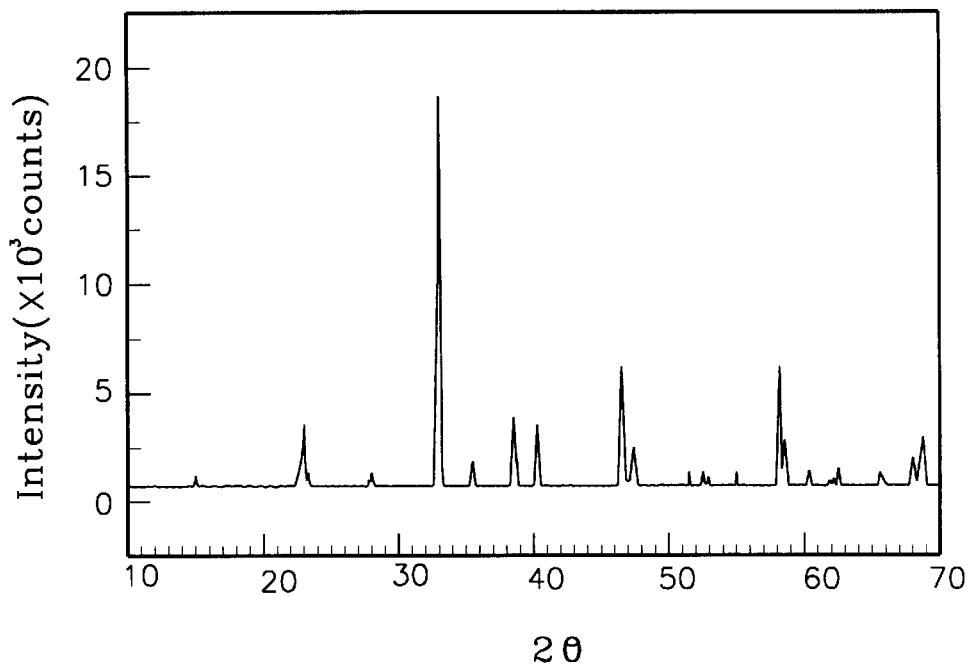
FIG. 1 is a graph showing the results of X-ray powder diffraction of $(Na_{0.4}Y_{0.6})(Ba_{0.9}Eu_{0.1})_2Cu_3O_{6+\delta}$ according to this invention.

This invention is characterized by a sodium-intervened superconductor expressed by the following Formula 1:

Formula 1

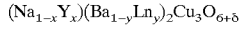

wherein, Ln is a trivalent lanthanide ion other than Ce and Pr; $0.1<x<0.9$; and $0.1<y<0.3$.

Also, this invention is also characterized by a process of manufacturing a sodium-intervened superconductor, wherein a mixture of $Y_2O_3$, $NaCuO_2$, $BaCuO_2$, $Ln_2O_3$ and CuO is sintered under the atmosphere of oxygen at 850–950° C. for 30–40 hours to prepare a sodium-intervened superconductor expressed by the above Formula 1.

This invention is explained in more detail as set forth hereunder:

This invention relates to a sodium-intervened superconductor characterized in that a) instead of mono oxide and carbonate, the use of a ternary oxide $NaCuO_2$, as a reactant may prevent the formation of impurities and b) partial substitution of bivalent barium by trivalent lanthanide group may allow the superconductor to possess a high $T_c$ and $J_c$.

The superconductor of this invention with a substituted lanthanide group ion (hereinafter referred to as "Ln-123T") expressed by the Formula 1 is prepared via reaction among $NaCuO_2$, $Y_2O_3$, $BaCuO_2$, $Ln_2O_3$ and CuO.

To form a stable structure of the Ln-123T expressed by the Formula 1 of this invention, it is preferred to maintain the amount of $Ln_2O_3$ in the molar ratio of 0.06–0.20 per mole of copper, while the corresponding amount of barium is added in the molar ratio of 0.46–0.60 per mole of copper. According to this invention, since $NaCuO_2$, a reactant for the manufacture of the Ln-123T has a structure in which a sodium atom is surrounded by 6 oxygen atoms, the evaporation of sodium at a high temperature may be prevented and its excellent reactivity may easily allow to form the Ln-123T. Hence, it is preferred to maintain the amount of $NaCuO_2$ in the molar ratio of 0.03–0.30 per mole of copper. If the amount of $NaCuO_2$ is less than 0.03 mole, a superconducting phase cannot be formed but in case of exceeding the amount of 0.30 mole, the drastic reduction of superconducting property may occur.

In addition, this invention is characterized in that unlike $YBa_2Cu_3O_{7-\delta}$, a partial substitution of trivalent lanthanide ion for the position of bivalent barium may allow the superconductor to possess a high $T_c$ and high $J_c$. According to this invention, the lanthanide oxide may include trivalent metal oxide of lanthanide group excluding cerium (Ce) and praseodymium (Pr), and it is preferred to select one atom from the group consisting of Nd, Sm, Eu and Gd.

As mentioned above, the Ln-123T superconductors of this invention are prepared through the reaction among $NaCuO_2$, $Y_2O_3$, $BaCuO_2$, $Ln_2O_3$ and CuO. The manufacturing method may be expressed by the following reaction Formula 1:

Reaction Formula 1

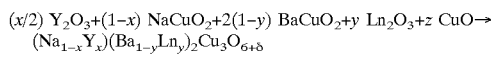

wherein, Ln represents Nd, Sm, Eu, or Gd.

All manufacturing processes are performed in a dry box, being filled with argon gas so as to avoid any contact with the air. As shown in Reaction Formula 1, the superconductor of this invention may be prepared in such a manner that while increasing the temperature, the mixture of several components is sintered at 850–950° C. for 30–40 hours under the atmosphere of oxygen and cooled slowly. More specifically, a mixture in the form of powder containing certain amounts of $NaCuO_2$, $Y_2O_3$, $BaCuO_2$, $Ln_2O_3$ and CuO according to each chemically equivalent ratio as in Reaction Formula 1, is placed in a dry box, weighed, molded in the form of pellet and charged to an alumina boat. Then, the pellet is placed in an electric furnace in the presence of oxygen. With a slow increase of temperature up to 850–950° C., the pellet is sintered at the same temperature for 30–40 hours and cooled slowly to prepare the Ln-123T of this invention. If the sintered temperature is less than 850° C., the formation of any superconductor phase is impossible but in case of exceeding the temperature of 950° C., the superconductor phase becomes decomposed. In addition, if the sintered time is longer than the above range, a copper oxide is generated as a major impurity.

Unlike the conventional method of manufacturing a superconductor designed to prepare its specimen using each oxide or carbonate as a starting material, this invention is characterized by the use of an excellent reactant such as a ternary oxide as aforementioned, thus reducing any impurities associated with reproducible specimens.

As such, the Ln-123T, so prepared by the manufacturing method of this invention, is characterized in that as illustrated in the accompanying FIG. 1, all peaks of the diffraction patterns may be indexed as a space group (Pmmm); as one manufacturing example according to this invention, the lattice constant of a superconductor prepared from Example 1 is a=3.84 Å, b=3.89 Å and c=11.67 Å and so the superconductor has an orthorhombic structure.

Figure 2:
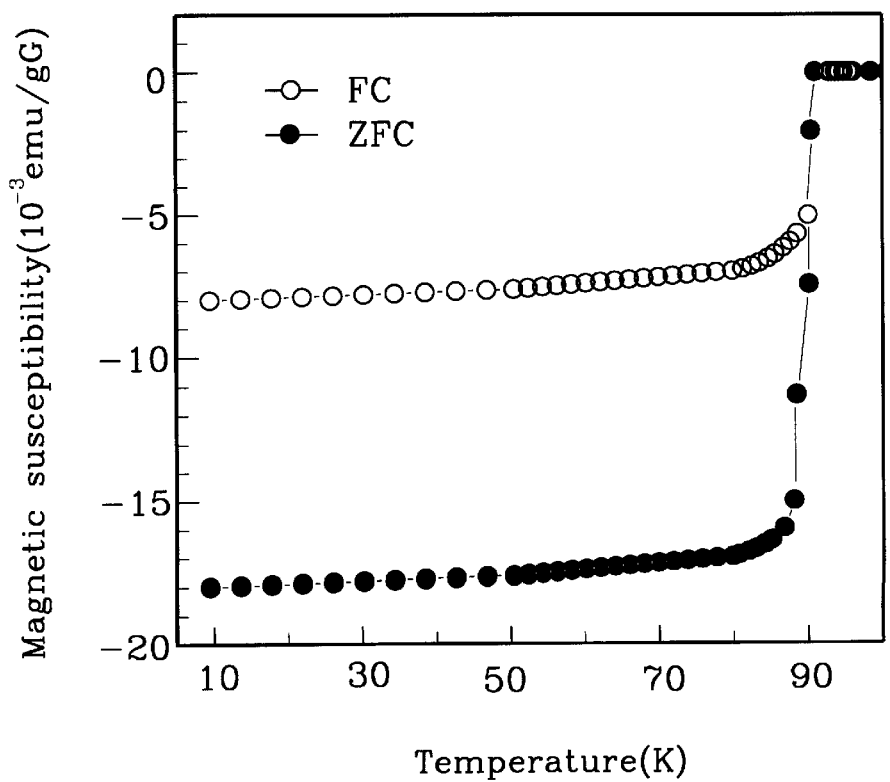
FIG. 2 is a graph showing the changes of magnetic susceptibility measured at a zero field cooled (ZFC) and field cooled (FC) conditions related to $(Na_{0.4}Y_{0.6})(Ba_{0.9}Eu_{0.1})_2Cu_3O_{6+\delta}$ according to this invention.
Figure 3:
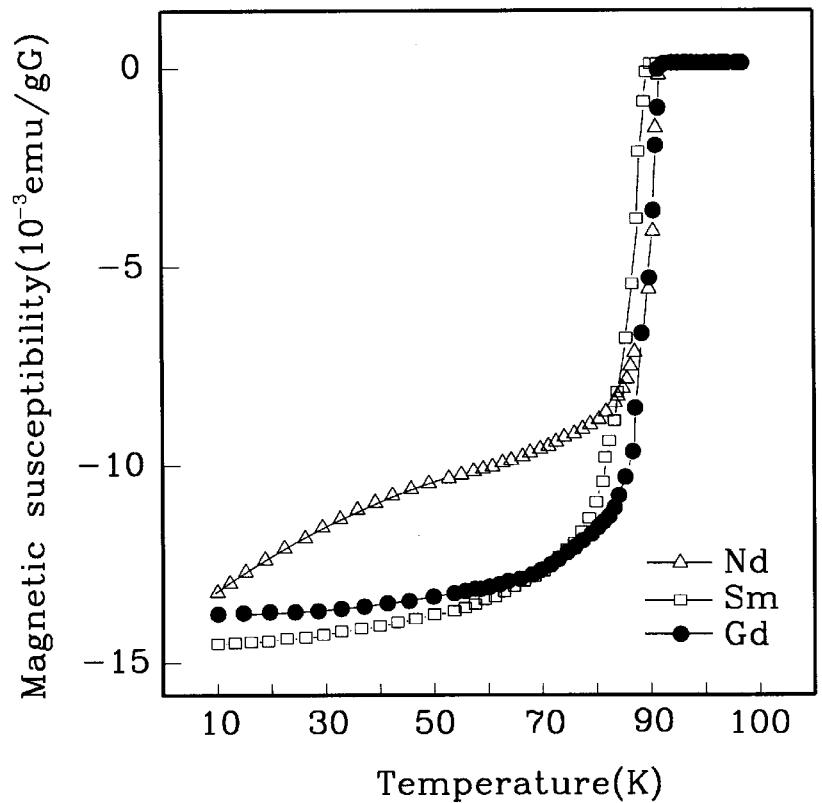
FIG. 3 is a graph showing the changes of magnetic susceptibility measured at the ZFC mode of $(Na_{0.4}Y_{0.6})(Ba_{0.9}Ln_{0.1})_2Cu_3O_{6+\delta}$, (Ln: Nd, Sm or Gd) according to this invention.

In addition, compared with $YBa_2Cu_3O_{7-\delta}$, Ln-123T of this invention is extremely stable in the air and as noted in the curve showing the changes in magnetic susceptibility as illustrated in FIGS. 2 and 3, its critical temperature is in the range of 90–92 K, being nearly similar level to $YBa_2Cu_3O_{7-\delta}$.

Figure 4:
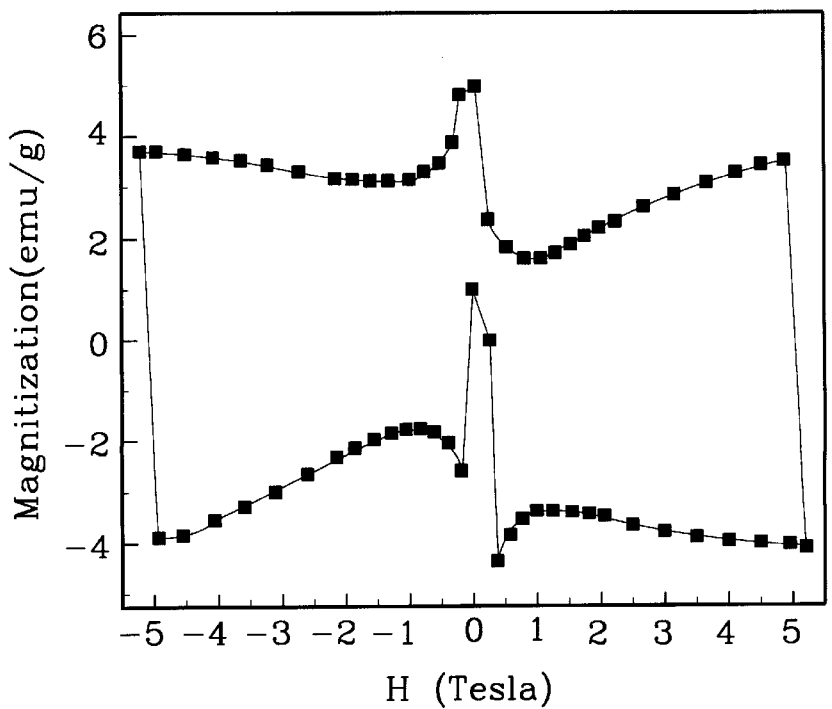
FIG. 4 is a graph showing the magnetic hysteresis loop of $(Na_{0.4}Y_{0.6})(Ba_{0.9}Eu_{0.1})_2CU_3O_{6+\delta}$ according to this invention.

Further, as noted in magnetic hysteresis loop of FIG. 4, the Ln-123T of this invention has far larger critical current density than that of $YBa_2Cu_3O_{7-\delta}$.

The following specific examples are intended to be illustrative of the invention and should not be construed as limiting the scope of the invention as defined by appended claims.

EXAMPLE 1

Preparation of $(Na_{0.4}Y_{0.6})(Ba_{0.8}Eu_{0.2})_2Cu_3O_{6+\delta}$

A mixture consisting of $Y_2O_3$ (0.2032 g), $NaCuO_2$ (0.1422 g), $BaCuO_2$ (1.2575 g), $Eu_2O_3$ (0.1056 g) and CuO (0.1909 g) was molded in the form of pellet and placed in an electric furnace under the atmosphere of oxygen. While increasing the temperature, the specimen was sintered at 850° C. for 30 hours under the atmosphere of oxygen. Then, the temperature of specimen was slowly cooled to prepare Eu123T with a same structure of $YBa_2Cu_3O_{7-\delta}$ having a $T_c$ of 92 K.

EXAMPLE 2–5

Preparation of $(Na_{0.4}Y_{0.6})(Ba_{0.8}Ln_{0.2})_2Cu_3O_{6+\delta}$

A superconductor represented by $(Na_{0.4}Y_{0.6})(Ba_{0.8}Ln_{0.2})_2Cu_3O_{6+\delta}$ was prepared in the same manner as in Example 1, except that each of $La_2O_3$ (0.0977 g), $Nd_2O_3$ (0.1009 g), $Sm_2O_3$ (0.1046 g) and $Gd_2O_3$ (0.1087 g) was used instead of $Eu_2O_3$ as defined in Example 1.

EXPERIMENTAL EXAMPLE 1

Post-Heat Treatment of $(Na_{0.4}Y_{0.6})(Ba_{0.8}Ln_{0.2})_2Cu_3O_{6+\delta}$

The specimens, so prepared from Examples 1–5, was sintered under the atmosphere of oxygen at 600° C. for 20 hours and followed by thermal treatment under the atmosphere of nitrogen under the same condition.

When the specimens were sintered under the atmosphere of oxygen, no change in the critical temperature was observed but the critical temperature was lowered followed by thermal treatment under the atmosphere of nitrogen under the same condition. However, when the specimens were sintered under the atmosphere of nitrogen at 400° C. for 20 hours, no change in the critical temperature was observed.

COMPARATIVE EXAMPLE 1

A final product was prepared in the same manner as in Example 1 but a thermal treatment under the atmosphere of oxygen was exempted.

As a result, all materials exhibit no superconductivity.

COMPARATIVE EXAMPLE 2

A final product was prepared in the same manner as in Example 1 except for the use of $Na_2CO_3$ (0.1272 g) instead of $NaCuO_2$ (0.1422 g) and as a result, the Ln-123T phase was not formed.

COMPARATIVE EXAMPLE 3

A final product was prepared in the same manner as in Example 1 with no addition of $Ln_2O_3$ and as a result, the Ln-123T phase was not produced.

EXPERIMENTAL EXAMPLE 2

Measurement of Superconducting Critical Temperature ($T_c$) and Critical Current Density ($J_c$)

The superconducting critical temperature and critical current density on a superconductor, so prepared from Example 1 and $YBa_2Cu_3O_{7-\delta}$ having an orthorhombic structure were measured, as shown in the following Table 1.

The critical temperature was measured by the method of 4-terminal resistance, while the critical current density from a magnetic hysteresis curve.

TABLE 1

| Category | $T_c$ (K) | $J_c$ at 10K (A/cm$^2$) |
|---|---|---|
| Example 1 | 92 | $2 \times 10^7$ |
| $YBa_2Cu_3O_{7-\delta}$ | 92 | $4 \times 10^6$ |

As described above, it has been revealed that the Ln-123T of this invention is superior to the conventional yttrium-based superconductor having an orthorhombic structure in terms of a) thermal stability, b) superconductivity having a critical temperature of about 92 K, c) high critical current density, d) the feasibility of manufacturing method including low sintering temperature, and e) reproducibility.

What is claimed is:

1. A sodium-intervened superconductor denoted by the following Formula 1:

Formula 1

$$(Na_{1-x}Y_x)(Ba_{1-y}Ln_y)_2Cu_3O_{6+\delta}$$

wherein, Ln is a trivalent lanthanide ion other than Ce and Pr; 0.1<x<0.9; and 0.1<y<0.3.

2. A process of manufacturing a sodium-intervened superconductor, wherein a mixture of $Y_2O_3$, $NaCuO_2$, $BaCuO_2$, $Ln_2O_3$ and CuO is sintered under the atmosphere of oxygen at 850–950° C. for 30–40 hours to prepare a sodium-intervened superconductor expressed by the following Formula 1:

Formula 1

$$(Na_{1-x}Y_x)(Ba_{1-y}Ln_y)_2Cu_3O_{6+\delta}$$

wherein, Ln is a trivalent lanthanide ion other than Ce and Pr; 0.1<x<0.9 and 0.1<y<0.3.

* * * * *